United States Patent [19]

Maugans

[11] 3,739,307

[45] June 12, 1973

[54] DUAL TURRET MECHANISM FOR GENERATING A TUNING VOLTAGE FOR A VOLTAGE TUNED AM-FM RADIO RECEIVER

[75] Inventor: Terrance W. Maugans, Kokomo, Ind.

[73] Assignee: General Motors Corporation, Detroit, Mich.

[22] Filed: Apr. 5, 1972

[21] Appl. No.: 241,241

[52] U.S. Cl. .................. 334/2, 74/10.2, 74/10.29, 325/459, 334/15, 334/51

[51] Int. Cl. .................. H03j 5/30, H03j 5/32

[58] Field of Search .................. 334/1, 2, 15, 49–51; 325/458, 459, 462, 464, 465; 74/10.1, 10.15, 10.2, 10.27, 10.29

[56] References Cited

UNITED STATES PATENTS 2,772,351 11/1956 Machlin .................. 334/2

*Primary Examiner*—Paul L. Gensler
*Attorney*—C. R. Meland, T. G. Jagodzinski and Howard N. Conkey

[57] ABSTRACT

An apparatus for generating tuning voltages for a voltage tuned AM-FM radio receiver including AM and FM turrets each including a plurality of potentiometer assemblies, the wiper arms of which are positioned so as to generate voltages for tuning the respective tuned circuits in the AM and FM sections of the radio receiver. Ratchet mechanisms for each of the AM and FM turrets index the respective turrets to selectively position the potentiometer assemblies in a tuning station at which a tuning voltage is picked off and supplied to the tuned circuits. A tuning mechanism is manually actuated and latched into engagement with a drive mechanism for the wiper arm of the potentiometer positioned at the tuning station and is operable to position the wiper arm to generate the desired tuning voltage. AM and FM band selector push buttons are provided to position the tuning mechanism so as to selectively position the wiper arm of the potentiometer in the tuning station of either the AM or FM turrets. An unlatching mechanism is provided for unlatching the tuning mechanism upon the actuation of either of the ratchet mechanisms or either of the AM and FM band selector push buttons.

4 Claims, 14 Drawing Figures

PATENTED JUN 12 1973 3,739,307

SHEET 3 OF 4

DUAL TURRET MECHANISM FOR GENERATING A TUNING VOLTAGE FOR A VOLTAGE TUNED AM-FM RADIO RECEIVER

This invention relates to an apparatus for generating a tuning voltage for a voltage tuned radio receiver and, more specifically, this invention relates to a dual turret mechanism for generating tuning voltages for AM and FM sections of a voltage tuned radio receiver utilizing a single tuning mechanism.

Conventional radio receivers include tuned circuits which are tuned to the desired frequency by means of a slug tuned coil. This form of receiver requires the physical placement of the slug in the tuned coil to effect tuning. As opposed to this conventional form of tuning, electronically tuned circuits have been developed including a voltage responsive reactive element in each tuned circuit which tunes the circuit in response to an applied voltage. In this form of tuning circuit, the receiver is tuned to the desired frequency by varying the voltage applied to the various voltage responsive reactive elements. It is the general object of this invention to provide an apparatus for generating tuning voltages for tuning this type of radio receiver.

It is another object of this invention to provide an apparatus for generating tuning voltages for both the FM and AM portions of a radio receiver with the tuning being effected by means of a single tuning mechanism.

It is another object of this invention to provide an apparatus for supplying tuning voltages to the AM and FM portions of a radio receiver in which a plurality of tuning voltages corresponding to desired frequencies are memorized in each of the AM and FM bands.

It is another object of this invention to provide an apparatus for supplying tuning voltages to a voltage tuned AM-FM radio receiver including AM and FM turrets, each of which contains a plurality of potentiometers whose wiper arms are tuned by a single tuning mechanism.

These and other objects of this invention may be best understood by reference to the following description of the preferred embodiment of this invention and the drawings in which.

Figure 1:
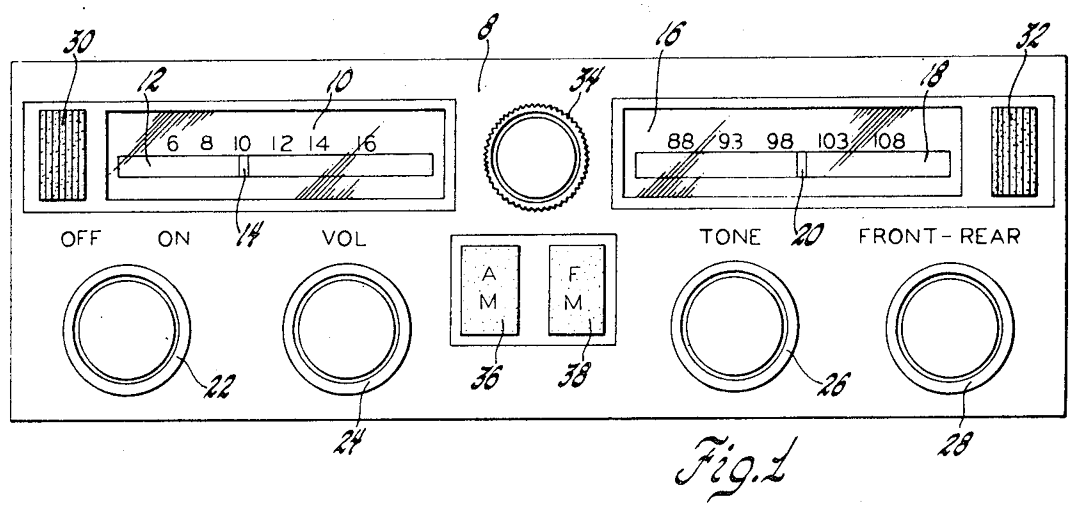
FIG. 1 is a front elevation of the tuning voltage generator illustrating the various control elements.
Figure 2:
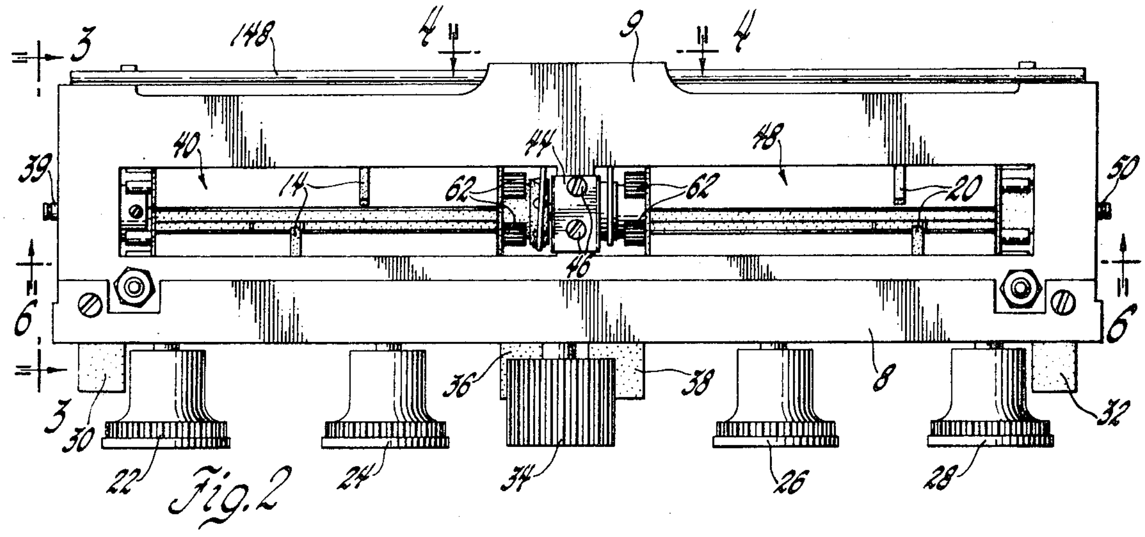
FIG. 2 is a top plan of the tuning voltage generator.

Referring to FIGS. 1 and 2, a face plate 8 is mounted on a support structure 9 and includes an AM dial face 10 having a window 12 through which an indicator needle 14 can be viewed and an FM dial face 16 having a window 18 through which an indicator needle 20 can be observed. An on-off knob 22, a volume control knob 24, a tone control knob 26 and a front-rear speaker control knob 28 are provided to perform the conventional functions represented thereby. A push button 30 is provided for sequentially selecting a number of memorized AM tuning voltages representing desired frequencies in the AM band and a push button 32 is provided to sequentially select a number of memorized FM tuning voltages representing desired frequencies in the FM band. A tuning knob 34 is provided to effect tuning of the radio receiver. An AM mode selector push button 36 is utilized to switch the receiver for AM reception and to permit tuning of the AM tuned circuits and an FM mode selector push button 38 is utilized to switch the receiver for FM reception and to permit the tuning of the FM tuned circuits.

Referring to FIG. 2, the AM tuning section includes an AM turret 40 which is mounted by a shaft 39 in an end plate of the support structure 9 and in one leg of a U-shaped bracket 44 mounted to the support structure 9 by a pair of screws 46. The FM tuning section includes an FM turret 48 mounted by a shaft 50 in the opposite end plate of the support structure 42 and in the second leg of the U-shaped bracket 44.

Referring to FIGS. 6 through 9, the structure of the AM turret 40 is illustrated, it being understood that the FM turret 48 is constructed in like manner with like portions having the same numeral identification. The AM turret 40 is comprised of a hexagon insulator 52 supported by the shaft 39 for rotation therewith. The insulator 52 is shown having six faces for illustration purposes only. The number of faces, which equals the number of frequencies which can be memorized in the AM band, can be any number desired. The turret 40 includes on each face of the hexagon insulator 52 a cutout 53 for housing a potentiometer assembly 54.

Figure 9:
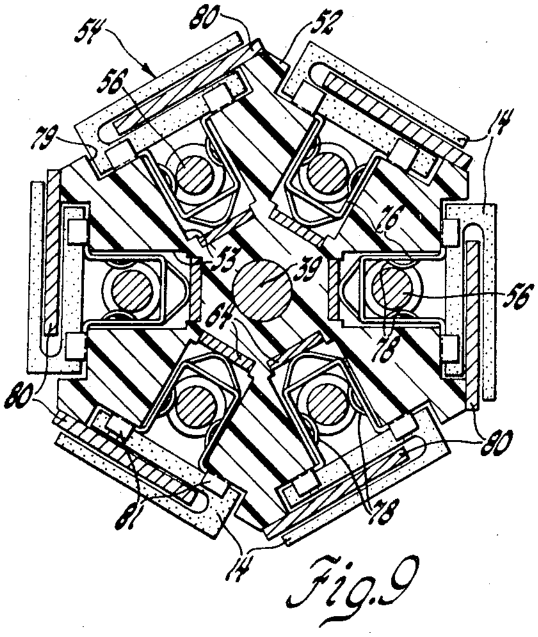
FIG. 9 is a cross-sectional view of the AM turret as viewed along lines 9—9 of FIG. 6.

Each potentiometer assembly 54 includes an electrically conductive threaded screw 56 extending the length of the hexagon insulator 52 and being mounted for rotation in an inner end plate 58 and an outer end plate 60, both of which are composed of insulating material. The end of each of the threaded screws 56 which projects through the inner end plate 58 has mounted thereon a gear member 62 with the remaining end projecting through the outer end plate 60 as shown. A resistive strip 64 is mounted at the bottom of each of the cutouts 53 as shown in FIG. 9 and extends the length of the hexagon insulator 52. One end of each of the resistive strips 64 is secured to and makes electrical contact with a slip ring 66 by screws 68, the slip ring 66 being mounted on the shaft 39 for rotation therewith.

The slip ring 66 is contacted by a brush 70 which is grounded to an external ground (not shown). The remaining end of each of the resistive strips 64 is connected to an insulating member 71 by means of contact screws 74, the insulating member 71 being mounted on the shaft 39 for rotation therewith. Each potentiometer assembly 54 also includes a wiper arm 76 which contacts the resistive strip 64 and includes projections 78 which engage the threads of the screw 56.

The indicator needle 14 is comprised of a substantially U-shaped insulating material having one leg disposed in a cutout 79 having a width greater than the width of the cutout 53. The indicator 14 is held in this position by a plate 80 which is glued or otherwise secured to the hexagon insulator 52 with a leg of the indicator needle disposed on each side thereof. Tabs 81 engage each side of one leg of the indicator 14 (one side shown) so as to position the indicator. As can be seen, when a potential is applied across one of the resistive strips 64 and the gear member 62 associated therewith is rotated to rotate the respective threaded screw 56, the wiper arm 76 and the indicator needle 14 attached thereto is moved along the hexagon member 52 with the potential at the wiper arm (and consequently the potential of the threaded screw 56) being a function of the position of the wiper arm 76 on the resistive strip 64.

A voltage is applied across the resistive strip 64 of the potentiometer assembly 54 which is positioned adjacent the window 12 by means of a contactor 82 which engages the contact screw 74 of that potentiometer assembly, the contactor 82 being coupled to a voltage source (not shown). By rotating the gear member 62 of the potentiometer assembly adjacent the window 12, the potential at the wiper arm 76 and consequently the potential of the threaded screw 56 is varied. This potential constitutes the tuning voltage for the AM portion of the receiver and is picked off of the threaded screw 56 by a contact member 83 which supplies the voltage to the AM tuned circuits to effect tuning thereof. As hereinafter referred to, the term "tuning station" refers to the position directly behind the windows 12 and 18. A particular potentiometer assembly 54 is in the tuning station when it is positioned adjacent the window 12 (window 18 with respect to the FM turret 48) where power is applied to the contact screw 74 through the contactor 82 and in which the tuning voltage is picked off by the contact member 83. As the turrets 40 and 48 are indexed about the respective shafts 39 and 50, the various potentiometer assemblies 54 are sequentially positioned in the tuning station with the voltage represented by the position of the potentiometer wiper arm 76 being supplied to the electronically tuned circuits of the AM and FM portions of the receiver.

Figure 3:
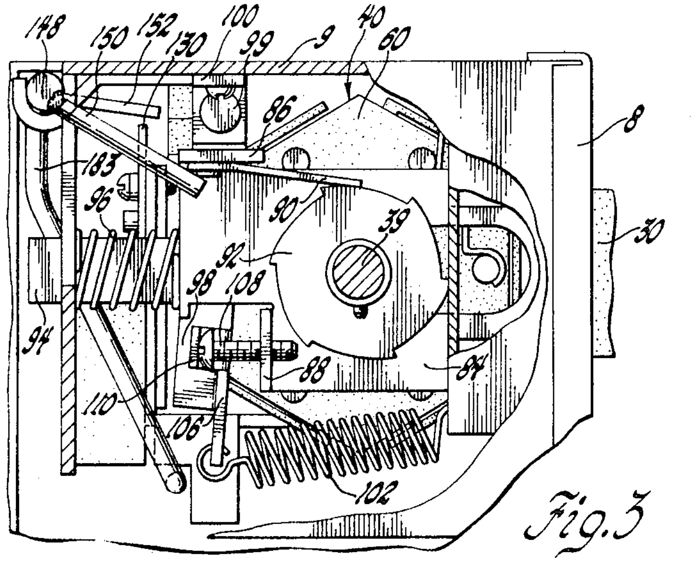
FIG. 3 is a schematic drawing of the ratcheting mechanism for the AM turret as viewed along lines 3—3 of FIG. 2.

Referring to FIG. 3, there is shown the ratcheting mechanism associated with the AM push button 30 for indexing the AM turret 40 to sequentially position the potentiometer assemblies 54 therein in the tuning station previously referred to, it being understood that the FM turret 48 is rotated by an identical ratcheting mechanism associated with the FM push button 32 with those portions illustrated having the same numeral identification.

The AM push button 30 is secured to a plate 84 having a tab 86 and a tab 88. A pawl 90 is secured to the tab 86 so as to engage a ratchet wheel 92, which is mounted on the shaft 39, when the push button 30 is depressed. A guide member 94, which is a projection of the main body of the plate 84, extends through a spring 96 and a guide slot (not shown) in the back plate of the support member 9. The spring 96 biases the push button mechanism 30 in its outward position and provides the force for indexing the ratchet wheel 92 and consequently the shaft 39 and the AM turret 40. Therefore, upon each actuation of the AM push button 30, a potentiometer assembly 54 is rotated out of the tuning station and the following potentiometer assembly 54 is rotated into the tuning station.

Figure 5:
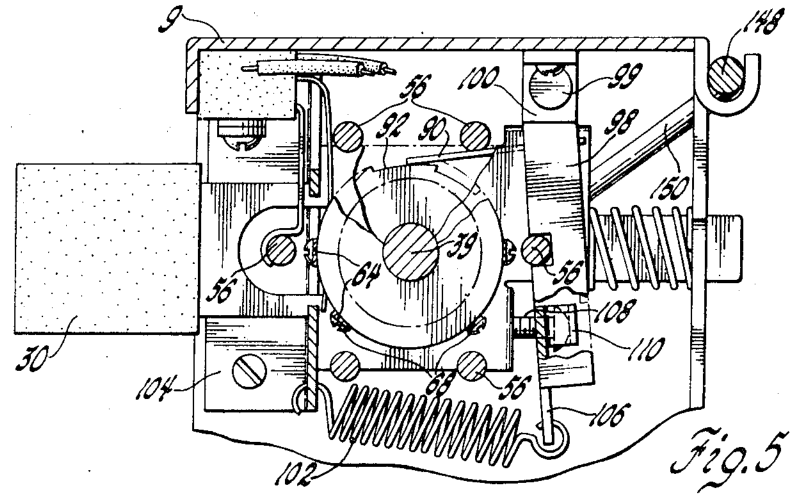
FIG. 5 is a schematic drawing illustrating the locking lever for the AM turret as viewed along lines 5—5 of FIG. 6.
Figure 6:
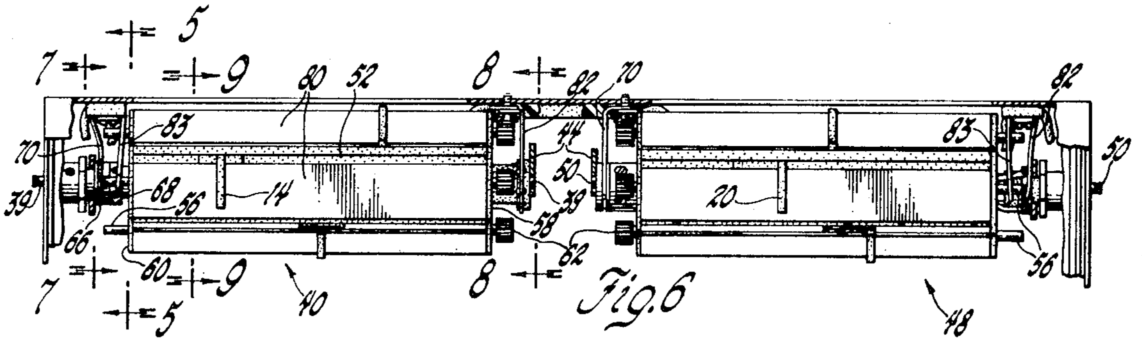
FIG. 6 is a schematic illustrating the AM and FM turrets and the signal pick-offs therefrom as viewed along lines 6—6 of FIG. 2.
Figure 7:
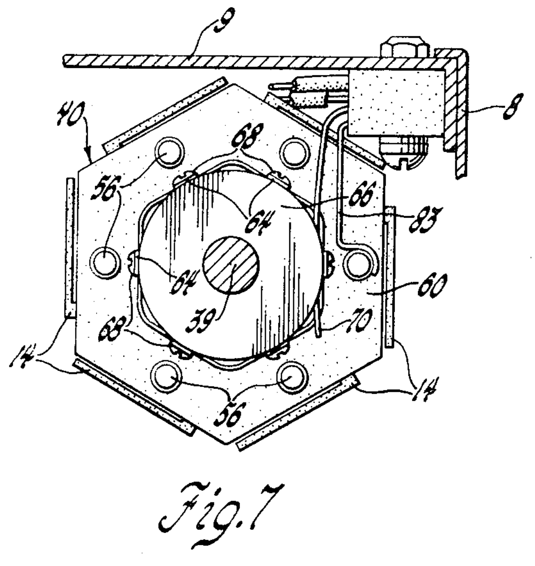
FIG. 7 is a schematic of one end of the AM turret as viewed along lines 7—7 of FIG. 6.
Figure 8:
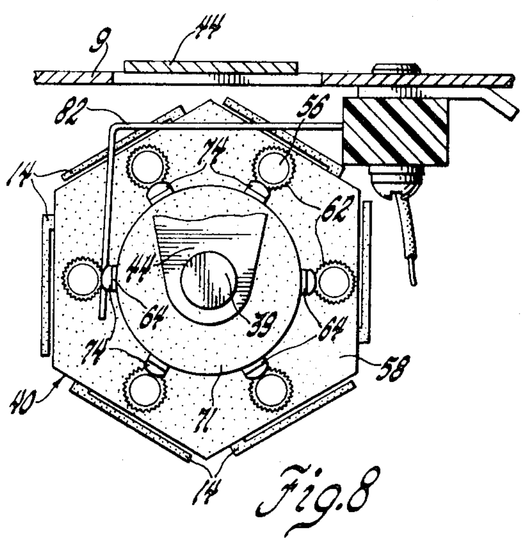
FIG. 8 is a schematic of the remaining end of the AM turret as viewed along lines 8—8 of FIG. 6.

Referring to FIGS. 3 and 5, an apparatus for locking the AM turret 40 securely into position is shown, it being understood that an identical apparatus is provided for locking the FM turret 48 with those portions illustrated having the same numeral identification. A locking lever 98 is secured by means of a rivet 99 to one leg of a bracket 100 whose remaining leg is attached to the the top portion of the support structure 9. The rivet 99 defines a pivot point about which the locking lever 98 rotates. A spring member 102 is secured at one end to a leg of a bracket 104 whose other leg is secured to the end portion of the support structure 9 and has the remaining side connected to an extension 106 of the locking lever 98. The locking lever 98 is notched such that the force exerted by the spring member 102 rotates the locking lever 98 so that the notch engages the portion of the threaded screw 56 extending beyond the outer end plate 60. When the AM push button 30 is depressed, a screw 108, which is fastened to the tab 88 of the plate 84, engages a tab 110 on the locking lever 98 to rotate the locking lever 98 about the rivet 99 to free the turret 40 for rotation. When the pawl 90 engages the ratchet wheel 92, the push button 30 is returned by the spring 96, the turret is indexed to its next position and the locking lever 98 again engages the threaded screw 56 of the following potentiometer assembly to lock the turret 40 into position.

Figure 4:
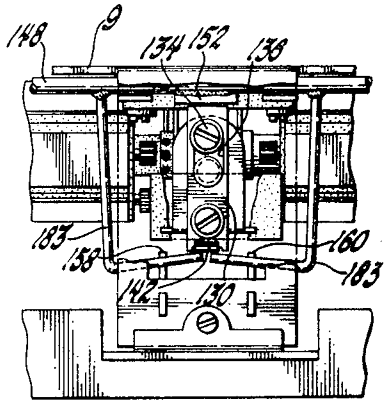
FIG. 4 is a view of the tuning knob latching release mechanism as viewed along lines 4—4 of FIG. 2.
Figure 10:
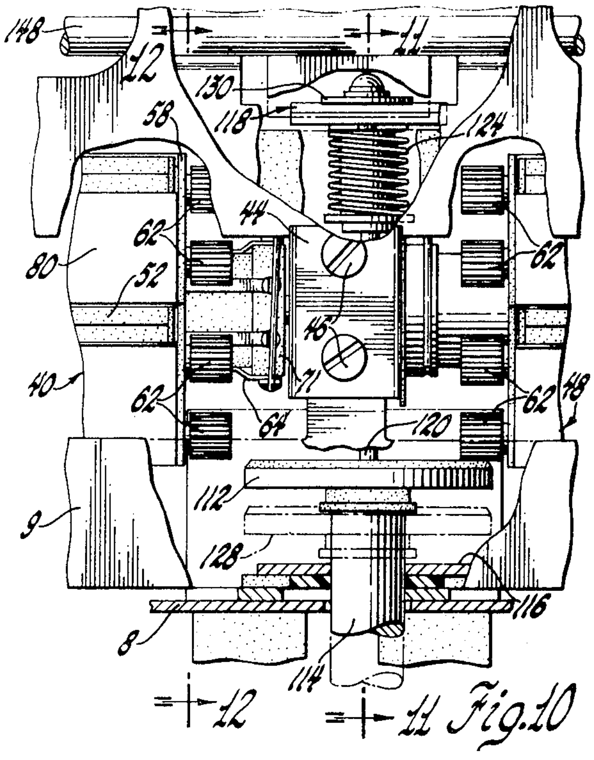
FIG. 10 is a schematic drawing of the tuning mechanism for positioning the potentiometer wiper arms in the AM and FM turrets.
Figure 11:
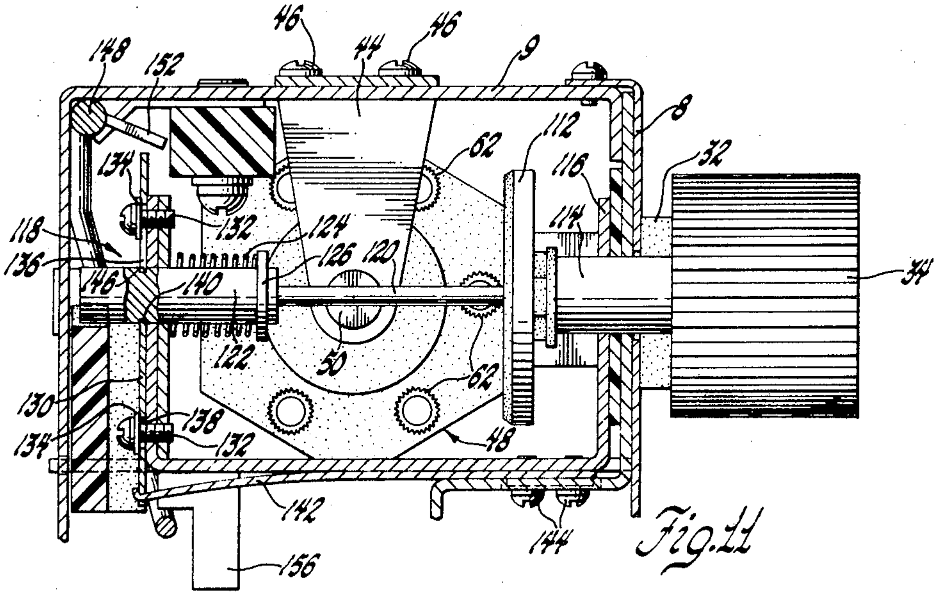
FIG. 11 is a schematic drawing of the latching mechanism for the tuning knob as viewed along lines 11—11 of FIG. 10.

Referring to FIGS. 4, 10 and 11, the tuning knob 34 is coupled to a potentiometer drive wheel 112 by a shaft 114. The shaft 114 is mounted in the front portion of a transport plate 116 and has rotational and perpendicular freedom of movement relative thereto. A latching mechanism 118 is coupled to the potentiometer drive wheel 112 by means of a shaft 120 and includes a member 122 which is supported by the back portion of the transport plate 116 in the same manner as the shaft 114 is supported by the front portion thereof. A spring 124 engages the back plate of the transport plate 116 and a lip 126 of the member 122 to bias the tuning knob 34 and the potentiometer drive wheel 112 in the broken line position 128 as shown in FIG. 10.

To effect tuning of the receiver, the tuning knob 34 and the attached potentiometer drive wheel 112 are depressed such that the potentiometer drive wheel 112 engages the gear member 62 associated with the potentiometer assembly 54 positioned in the tuning station of either the AM turret 40 or the FM turret 48. When so depressed, the latching mechanism 118 latches the tuning wheel 34 and the potentiometer drive wheel 112 into engagement with that gear member 62. This latching is accomplished in the latching mechanism 118 by means of a strip member 130 which is mounted to the back portion of the transport plate 116 by screws 132 and washers 134. This mounting is such that relative movement between the strip member 130 and the transport plate 116 is permitted. The strip member 130 has a slot 136 and a slot 138 to permit vertical movement of the strip member 130 relative to the back portion of the transport plate 116. The slot 136 includes a lower lip 140 which is biased against the member 122 by a leaf spring 142 which is secured to the transport plate 116 by a screw 144. When the tuning knob 34 is depressed to position the potentiometer drive wheel 112 against the gear member 62, the lower lip 140 is biased by the leaf spring 142 into a notch 146 in the member 122. Thereafter, when the tuning knob 34 is released, the plate 130 holds the potentiometer drive wheel 112 into engagement with the gear member 62, so that when the tuning knob 34 is rotated, the gear member 62 is rotated thereby due to frictional coupling to position the wiper arm 76 of the potentiometer assembly 54 in the tuning station to effect tuning of the radio receiver.

The latching mechanism 118 is actuated to release the tuning knob 34 and the potentiometer drive wheel 112 by means of a shaft 148 which is mounted, as seen in FIG. 2, to the support structure 9 in a manner so as to permit rotational movement thereof relative thereto. Referring to FIGS. 3 and 11, a cam follower 150 is attached to the shaft 148 in a position so as to be engaged by the tab 86, which serves as a cam, when the AM push button 30 is actuated. As the AM push button 30 is actuated, the tab 86 engages the cam follower 150 to rotate the shaft 148 in a clockwise direction. An actuating member 152 is secured to the shaft 148 such that as the shaft 148 is rotated, it is also rotated to engage the upper portion of the strip member 130 which is moved against the force of the leaf spring 142. Consequently, the lower lip 140 of the slot 136 is moved out of engagement with the notch 146 to allow the spring 124 to move the tuning knob 34 and the potentiometer drive wheel 112 out of engagement with the gear member 62. It is understood that a cam follower identical to the cam follower 150 is also associated with the FM push button 32 such that the latching mechanism 118 is actuated to release the potentiometer drive wheel 112 each time the AM or FM turrets 40 and 48 are indexed to position a different potentiometer assembly 54 within the tuning station as previously described.

To select between AM and FM bands of the radio receiver and to selectively position the potentiometers in either the AM or FM turrets 40 and 48, the transport plate 116 is moved laterally so that the potentiometer drive wheel 112 engages either the gear members 62 of the turret 40 or engages the like gear members 62 of the turret 48 when the tuning knob 34 is depressed and latched as previously described. This is accomplished by selective actuation of the AM and FM mode selector push button switches 36 and 38 of FIG. 1.

Figure 12:
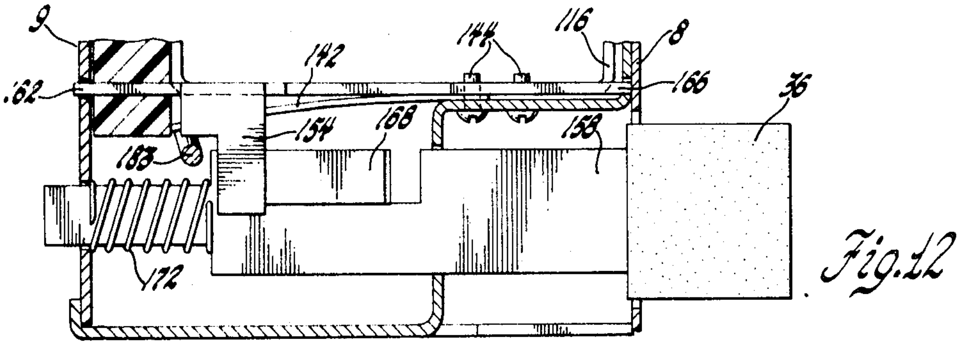
FIG. 12 is a schematic drawing of the AM band selector mechanism as viewed along lines 12—12 of FIG. 10.
Figure 13:
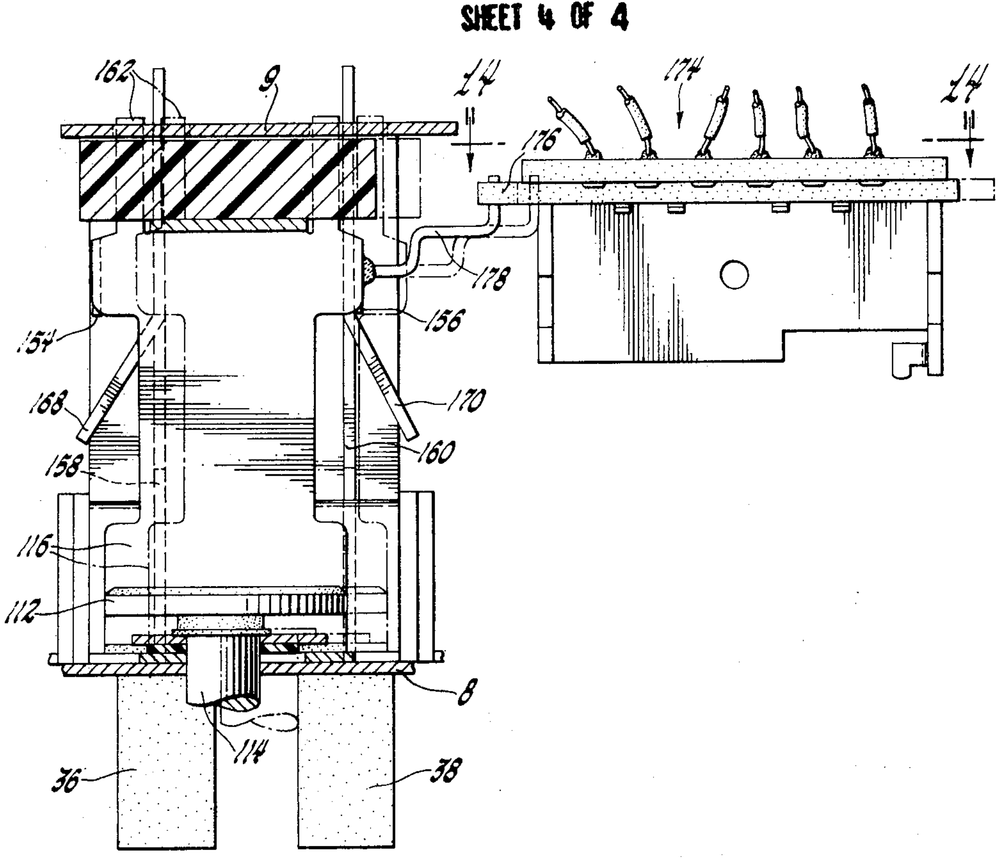
FIG. 13 is a schematic drawing illustrating the interaction between the band selector push buttons and the tuning mechanism transport plate.

As seen in FIGS. 12 and 13, the transport plate 116 includes two projections 162 extending through slots in the back portion of the support member 9 and two projections 166 (one of which is illustrated in FIG. 12) extending through slots in the front portion of the support member 9. These projections and slots serve to support the transport plate 116 in the support structure 9 with the slots having a width which permits lateral movement of the transport plate 116 relative to the support structure 9.

Referring to FIGS. 11, 12 and 13, the transport plate 116 includes a cam follower 154 and a cam follower 156. The AM mode selector push button switch 36 includes an actuating member 158 and the FM mode selector push button switch includes an actuating member 160. The actuating member 158 includes a cam 168 and the actuating member 160 includes a cam 170. The cam follower 154 on the transport plate 116 is engaged by the cam 168 when the AM mode selector push button switch 36 is depressed and the cam follower 156 is engaged by the cam 170 when the FM mode selector push button switch 38 is depressed.

As seen in FIG. 13, when either the AM or FM mode selector push button switches 36 or 38 is depressed, the transport plate 116 is moved to a first or second position to position the potentiometer tuning wheel 112 so as to engage the gear member 62 in the tuning station of either the AM turret 40 or the FM turret 48 when the tuning knob 34 is depressed.

Referring again to FIG. 12, a spring 172 biases the actuating member 158 and the AM mode selector push button switch 36 in the outward position. A similar spring is associated with the actuating member 160 and the FM mode selector push button switch 38.

Figure 14:
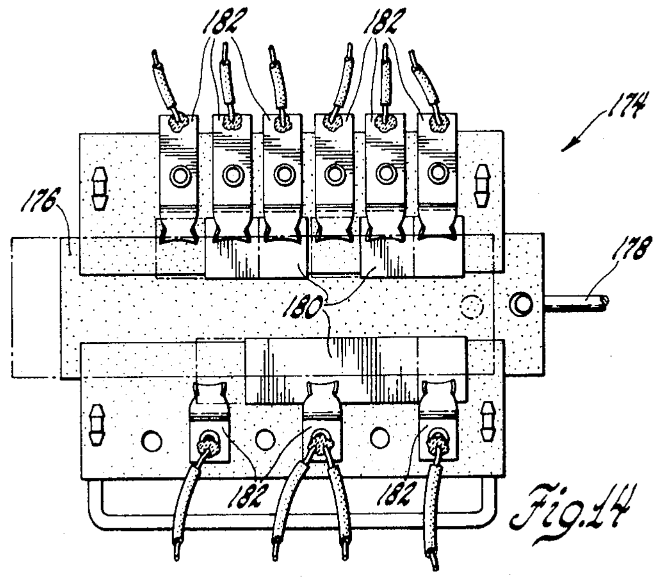
FIG. 14 is a view of the contact board of FIG. 13 taken along lines 14—14 of FIG. 13.

The movement of the transport plate 116 by the AM and FM mode selector push button switches 36 and 38 also effects electrical switching between the AM and FM portions of the radio receiver. As seen in FIGS. 13 and 14, a contact board 174 has a movable portion 176 coupled to the cam follower 156 of the transport plate 116 by coupling member 178. The movable portion 176 includes contacts 180 which are moved relative to stationary contacts 182 to effect the electrical switching between the AM and FM bands of the radio receiver.

As the potentiometer drive wheel 112 may be latched into engagement with the gear member 62 of either the AM turret 40 or the FM turret 48 when either the AM or FM mode selector push button switch 36 or 38 is depressed, latching release members 183 are secured to the shaft 148. These latching release members 183 are positioned such that when either the actuating member 158 associated with the AM mode selector push button switch 36 or the actuating member 160 associated with the FM mode selector push button switch 38 are depressed, they are moved thereby to rotate the shaft 148 to unlatch the latching mechanism 118 in the same manner as described with reference to the push buttons 30 and 32.

From the foregoing description, it can be seen that after having positioned each of the wiper arms 76 of all the potentiometer assemblies 54 of both the AM and FM turrets 40 and 48 to positions representing desired frequencies in the AM and FM bands in the manner previously described, it is only necessary thereafter for the operator to actuate the AM or FM mode selector push button 36 or 38 and index the respective AM or FM turret 40 or 48 to select any one of those frequencies.

The detailed description of the preferred embodiment of the invention for the purpose of explaining the principles thereof is not to be considered as limiting or restricting the invention, since many modifications may be made by the exercise of skill in the art without departing from the scope of the invention.

I claim:

1. An apparatus for generating tuning voltages for a voltage tuned receiver operating in first and second frequency bands comprising a support structure; first and second turrets carried by the support structure for rotational movement relative thereto, each of said turrets including therein a plurality of potentiometer assemblies, each of said potentiometer assemblies including a pair of power input terminals, an output terminal, a wiper arm and wiper arm drive means for positioning said wiper arm when said drive means is actuated; a first tuning station including first signal pick-off means for sequentially engaging the output terminals of the potentiometer assemblies in the first turret as said turret is rotated; means for applying a voltage across the power input terminal of the potentiometer assembly whose output terminal is engaged by the first signal pick-off means, said potentiometer assembly supplying a voltage at its output terminal having a magnitude directly related to the position of the wiper arm thereof; means for coupling the first signal pick-off means to the receiver to effect tuning thereof to a frequency in the first frequency band determined by the magnitude of the voltage at the output terminal engaged by the first signal pick-off means; first manually operable indexing means for rotating the first turret so that each of the output terminals of the potentiometer assemblies therein are sequentially engaged by the first signal pick-off means; a second tuning station including second signal pick-off means for sequentially engaging the output terminals of the potentiometer assemblies in the second turret as said turret is rotated; means for applying a voltage across the power input terminal of the potentiometer assembly whose output terminal is engaged by the second signal pick-off means, said potentiometer assembly supplying a voltage at its output terminal having a magnitude directly related to the position of the wiper arm thereof; means for coupling the second signal pick-off means to the receiver to effect tuning thereof to a frequency in the second frequency band determined by the magnitude of the voltage at the output terminal engaged by the second signal pick-off means; second manually operable indexing means for rotating the second turret so that each of the output terminals of the potentiometer assemblies therein are sequentially engaged by the second signal pick-off means; manually operable tuning means for positioning the wiper arms of the potentiometer assemblies in the first and second turrets, said tuning means including means for actuating the wiper arm drive means of the potentiometer assembly in the first turret whose output terminal is engaged by the first signal pick-off means when said tuning means is in a first position to position said wiper arm to vary the voltage at the output terminal of said potentiometer assembly to a magnitude representing a desired frequency in the first frequency band and actuating the wiper arm drive means of the potentiometer assembly in the second turret whose output terminal is engaged by the second signal pick-off means when said tuning means is in a second position to position said wiper arm to vary the voltage at the output terminal of said potentiometer assembly to a magnitude representing a desired frequency in the second frequency band; a first manually operable band selector means for positioning the tuning means in the first position and switching the receiver for operation in the first frequency band; and a second manually operable band selector means for positioning the tuning mechanism in the second position and switching the receiver for operation in the second frequency band, whereby the tuning means is effective for positioning all of the wiper arms of the potentiometer assemblies in both of the first and second turrets and the first and second indexing means are operable to rotate the first and second turrets so that the output terminals are sequentially engaged by the first and second signal pick-off means to effect tuning of the receiver in either the first or second frequency bands as determined by the first and second band selector means.

2. An apparatus for generating tuning voltages for a voltage tuned receiver operating in first and second frequency bands comprising a support structure; first and second turrets carried by the support structure for rotational movement relative thereto, each of said turrets including therein a plurality of potentiometer assemblies, each of said potentiometer assemblies including a pair of power input terminals, an output terminal, a wiper arm and wiper arm drive means for positioning said wiper arm when said drive means is actuated; a first tuning station including first signal pick-off means for sequentially engaging the output terminals of the potentiometer assemblies in the first turret as said turret is rotated; means for applying a voltage across the power input terminal of the potentiometer assembly whose output terminal is engaged by the first signal pick-off means, said potentiometer assembly supplying a voltage at its output terminal having a magnitude directly related to the position of the wiper arm thereof; means for coupling the first signal pick-off means to the receiver to effect tuning thereof to a frequency in the first frequency band determined by the magnitude of the voltage at the output terminal engaged by the first signal pick-off means; first manually operable indexing means for rotating the first turret so that each of the output terminals of the potentiometer assemblies therein are sequentially engaged by the first signal pick-off means; a second tuning station including second signal pick-off means for sequentially engaging the output terminals of the potentiometer assemblies in the second turret as said turret is rotated; means for applying a voltage across the power input terminal of the potentiometer assembly whose output terminal is engaged by the second signal pick-off means, said potentiometer assembly supplying a voltage at its output terminal having a magnitude directly related to the position of the wiper arm thereof; means for coupling the second signal pick-off means to the receiver to effect tuning thereof to a frequency in the second frequency band determined by the magnitude of the voltage at the output terminal engaged by the second signal pick-off means; second manually operable indexing means for rotating the second turret so that each of the output terminals of the potentiometer assemblies therein are sequentially engaged by the second signal pick-off means; a transport member movable between first and second positions; manually operable tuning means carried by the transport member, said tuning means having a neutral position and a drive position in which the tuning means engages to actuate the potentiometer drive means of the potentiometer assembly in the first turret whose output terminal is engaged by the first signal pick-off means to position the wiper arm thereof when the transport member is in the first position and engages to actuate the potentiometer drive means of the potentiometer assembly in the second turret whose output terminal is engaged by the second signal pick-off means to position the wiper arm thereof when the transport member is in the second position; a first manually actuated band selector means for positioning the transport member in the first position when actuated; a second manually actuated band selector means for positioning the transport member in the second position when actuated; and switch means coupled to the receiver and responsive to the first and second manually actuated band selector means for switching the receiver for operation in the first band when the first manually actuated band selector means is actuated and for switching the receiver for operation in the second frequency band when the second manually actuated band selector means is actuated, whereby the tuning means is effective for positioning all of the wiper arms of the potentiometer assemblies in both of the first and second turrets and the first and second indexing means are operable to rotate the first and second turrets so that the output terminals are sequentially engaged by the first and second signal pick-off means to effect tuning of the receiver in either the first or second frequency bands as determined by the first and second band selector means.

3. An apparatus for generating tuning voltages for a voltage tuned receiver operating in first and second frequency bands comprising a support structure; first and second turrets carried by the support structure for rotational movement relative thereto, each of said turrets including therein a plurality of potentiometer assemblies, each of said potentiometer assemblies including a pair of power input terminals, an output terminal, a wiper arm and wiper arm drive means for positioning said wiper arm when said drive means is actuated; a first tuning station including first signal pick-off means for sequentially engaging the output terminals of the potentiometer assemblies in the first turret as said turret is rotated; means for applying a voltage across the power input terminal of the potentiometer assembly whose output terminal is engaged by the first signal pick-off means, said potentiometer assembly supplying a voltage at its output terminal having a magnitude directly related to the position of the wiper arm thereof; means for coupling the first signal pick-off means to the receiver to effect tuning thereof to a frequency in the first frequency band determined by the magnitude of the voltage at the output terminal engaged by the first signal pick-off means; first manually operable indexing means for rotating the first turret so that each of the output terminals of the potentiometer assemblies therein are sequentially engaged by the first signal pick-off means; a second tuning station including second signal pick-off means for sequentially engaging the output terminals of the potentiometer assemblies in the second turret as said turret is rotated; means for applying a voltage across the power input terminal of the potentiometer assembly whose output terminal is engaged by the second signal pick-off means, said potentiometer assembly supplying a voltage at its output terminal having a magnitude directly related to the position of the wiper arm thereof; means for coupling the second signal pick-off means to the receiver to effect tuning thereof to a frequency in the second frequency band determined by the magnitude of the voltage at the output terminal engaged by the second signal pick-off means; second manually operable indexing means for rotating the second turret so that each of the output terminals of the potentiometer assemblies therein are sequentially engaged by the second signal pick-off means; a transport member movable between first and second positions; manually operable tuning means carried by the transport member, said tuning means having a neutral position and a drive position in which the tuning means engages to actuate the potentiometer drive means of the potentiometer assembly in the first turret whose output terminal is engaged by the first signal pick-off means to position the wiper arm thereof and the transport member is in the first position and engages to actuate the potentiometer drive means of the potentiometer assembly of the second turret whose output terminal is engaged by the second signal pick-off means to position the wiper arm thereof when the transport member is in the second position; a first manually operable band selector means for positioning the transport member in the first position when actuated; a second manually operable band selector means for positioning the transport member in the second position when actuated; means for biasing the tuning means in the neutral position; latching means for latching the tuning means in the drive position when said tuning means is positioned from the neutral position to the drive position; and unlatching means for unlatching the tuning means when one of the first or second manually operable indexing means is operated or the first or second manually operable band selector means is operated, whereby the tuning means is returned to its neutral position by the means for biasing the tuning means, whereby the tuning means is effective for positioning all of the wiper arms of the potentiometer assemblies in both of the first and second turrets and the first and second indexing means are operable to rotate the first and second turrets so that the output terminals are sequentially engaged by the first and second signal pick-off means to effect tuning of the receiver in either the first or second frequency bands as determined by the first and second band selector means.

4. A two-band tuning system comprising: a pair of coaxial adjacent turret tuners for said bands, respectively, each adapted to be rotated to selected positions for indexing respective tuning elements for circuit operation; a drive member located between said tuners and effective in a first axial position to engage one tuner and in a second axial position to engage the other tuner, said drive member being effective in the first position to move the first tuner in tuning of the indexed tuning element and in the second position to move the second tuner in tuning of the indexed tuning element; manually effective means to locate the drive member in said first and second positions, respectively, and effective to select between said tuners; and means for selectively rotating the first and second tuners, respectively, to index the respective tuning elements.

* * * * *